(12) United States Patent
Rokusha

(10) Patent No.: US 12,359,127 B2
(45) Date of Patent: Jul. 15, 2025

(54) POROUS LIQUID CRYSTAL POLYMER SHEET, METAL LAYER-ATTACHED POROUS LIQUID CRYSTAL POLYMER SHEET, AND ELECTRONIC CIRCUIT BOARD

(71) Applicant: Murata Manufacturing Co., Ltd., Nagaokakyo (JP)

(72) Inventor: Yuki Rokusha, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/322,794

(22) Filed: May 24, 2023

(65) Prior Publication Data

US 2023/0295507 A1 Sep. 21, 2023

Related U.S. Application Data

(63) Continuation of application No. PCT/JP2022/023126, filed on Jun. 8, 2022.

(30) Foreign Application Priority Data

Jun. 9, 2021 (JP) .................. 2021-096551

(51) Int. Cl.
| | |
|---|---|
| *G02F 1/1333* | (2006.01) |
| *C09K 19/06* | (2006.01) |
| *C09K 19/10* | (2006.01) |
| *C09K 19/54* | (2006.01) |
| *H05K 1/03* | (2006.01) |
| *C09K 19/52* | (2006.01) |

(52) U.S. Cl.
CPC ............ *C09K 19/10* (2013.01); *C09K 19/062* (2013.01); *C09K 19/54* (2013.01); *H05K 1/03* (2013.01); *C09K 2019/521* (2013.01)

(58) Field of Classification Search
CPC ...... C09K 19/10; C09K 19/062; C09K 19/54; C09K 19/3809; C09K 2019/521; G02F 1/1333

See application file for complete search history.

(56) References Cited

U.S. PATENT DOCUMENTS

| | | | |
|---|---|---|---|
| 5,545,475 A | 8/1996 | Korleski | |
| 7,294,393 B2 * | 11/2007 | Murai | B32B 7/12 |
| | | | 428/209 |
| 2019/0202978 A1 | 7/2019 | Washino | |
| 2021/0060895 A1 | 3/2021 | Tokuyama et al. | |
| 2023/0295506 A1 * | 9/2023 | Rokusha | C09K 19/062 |
| | | | 252/299.01 |
| 2023/0295507 A1 * | 9/2023 | Rokusha | C09K 19/54 |
| | | | 252/299.01 |

FOREIGN PATENT DOCUMENTS

| | | |
|---|---|---|
| CN | 103467984 A | 12/2013 |
| JP | H06098666 A | 12/1994 |
| JP | 2000-351864 A | 12/2000 |
| JP | 2001-072789 A | 3/2001 |
| JP | 3618760 B2 | 2/2005 |
| JP | 2009127024 A | 6/2009 |
| JP | 2016051820 A | 4/2016 |
| JP | 2017-119378 A | 7/2017 |
| JP | 2018109090 A | 7/2018 |
| JP | 6434195 B2 | 12/2018 |
| JP | 2019-167484 A | 10/2019 |
| WO | 2020218140 A1 | 10/2020 |

OTHER PUBLICATIONS

International Search Report in PCT/JP2022/023126, mailed Aug. 2, 2022, 2 pages.
International Search Report in PCT/JP2022/023141, mailed Aug. 2, 2022, 2 pages.

* cited by examiner

*Primary Examiner* — Geraldina Visconti
(74) *Attorney, Agent, or Firm* — ArentFox Schiff LLP

(57) ABSTRACT

A porous liquid crystal polymer sheet that includes: a resin sheet having pores and containing a first component composed of a liquid crystal polymer and a second component accounting for a highest weight percentage of the resin sheet except for the first component, wherein, when a region containing the second component is defined as a first region, and a region having a smaller content of the second component than the first region is defined as a second region in the porous liquid crystal polymer sheet, the first region has higher compressive strength than the second region, the second component has an average particle size smaller than an average pore size of the pores, and the second component is not in contact with an inside of the pores.

19 Claims, 3 Drawing Sheets

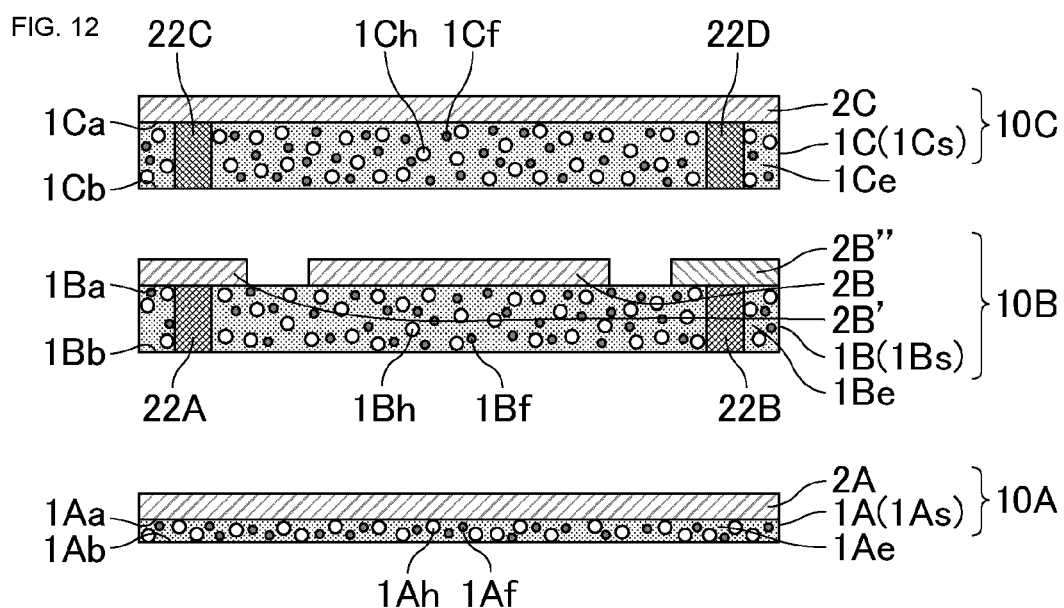

POROUS LIQUID CRYSTAL POLYMER SHEET, METAL LAYER-ATTACHED POROUS LIQUID CRYSTAL POLYMER SHEET, AND ELECTRONIC CIRCUIT BOARD

CROSS REFERENCE TO RELATED APPLICATIONS

The present application is a continuation of International application No. PCT/JP2022/023126, filed Jun. 8, 2022, which claims priority to Japanese Patent Application No. 2021-096551, filed Jun. 9, 2021, the entire contents of each of which are incorporated herein by reference.

FIELD OF THE INVENTION

The present invention relates to a porous liquid crystal polymer sheet, a metal layer-attached porous liquid crystal polymer sheet, and an electronic circuit board.

BACKGROUND OF THE INVENTION

Patent Document 1 discloses, as a porous liquid crystal polymer sheet, a porous composite sheet including (a) polytetrafluoroethylene and (b) a liquid crystal polymer, wherein the sheet is formed from polytetrafluoroethylene particulates and liquid crystal polymer particulates, the sheet has a continuous porous matrix of polytetrafluoroethylene in which the liquid crystal polymer is contained, and the sheet has a concentration of the liquid crystal polymer in the range of 2 to 85 vol %.

Patent Document 1: Japanese Patent No. 3618760

SUMMARY OF THE INVENTION

The porous composite sheet disclosed in Patent Document 1, however, has low compressive strength because the porous composite sheet contains polytetrafluoroethylene. The use of porous liquid crystal polymer sheets with low compressive strength, such as the porous composite sheet disclosed in Patent Document 1, to produce, for example, electronic circuit boards used in various electronic devices causes difficulties of processing in pressure bonding of metal layers to porous liquid crystal polymer sheets or in formation of via holes penetrating porous liquid crystal polymer sheets.

The present invention has been made to solve the above problem and aims at providing a porous liquid crystal polymer sheet with high compressive strength. The present invention also aims at providing a metal layer-attached porous liquid crystal polymer sheet having the porous liquid crystal polymer sheet. The present invention further aims at providing an electronic circuit board having the metal layer-attached porous liquid crystal polymer sheet.

A porous liquid crystal polymer sheet of the present invention includes: a resin sheet having pores and containing a first component composed of a liquid crystal polymer and a second component accounting for a highest weight percentage of the resin sheet except for the first component, wherein, when a region containing the second component is defined as a first region, and a region having a smaller content of the second component than the first region is defined as a second region in the porous liquid crystal polymer sheet, the first region has higher compressive strength than the second region, the second component has an average particle size smaller than an average pore size of the pores, and the second component is not in contact with an inside of the pores.

A metal layer-attached porous liquid crystal polymer sheet of the present invention includes the porous liquid crystal polymer sheet of the present invention and a metal layer on at least one main surface of the porous liquid crystal polymer sheet.

An electronic circuit board of the present invention includes the metal layer-attached porous liquid crystal polymer sheet of the present invention.

The present invention can provide a porous liquid crystal polymer sheet with high compressive strength. The present invention can also provide a metal layer-attached porous liquid crystal polymer sheet having the porous liquid crystal polymer sheet. The present invention can further provide an electronic circuit board having the metal layer-attached porous liquid crystal polymer sheet.

BRIEF DESCRIPTION OF THE DRAWINGS

FIG. 12 is a schematic cross-sectional view of a step of forming interconnecting conductors in the example method for producing the electronic circuit board of the present invention.

DETAILED DESCRIPTION OF THE PREFERRED EMBODIMENTS

A porous liquid crystal polymer sheet of the present invention, a metal layer-attached porous liquid crystal polymer sheet of the present invention, and an electronic circuit board of the present invention will be described below. The present invention is not limited to the following configurations and may be appropriately modified without departing from the spirit of the present invention. A combination of two or more individual preferred configurations described below is also within the present invention.

The porous liquid crystal polymer sheet of the present invention includes a resin sheet having pores and containing a first component composed of a liquid crystal polymer and a second component accounting for the highest weight percentage of the resin sheet except for the first component.

In this description, the "sheet" and the "film" are synonyms and not distinguished by their thickness.

Figure 1:
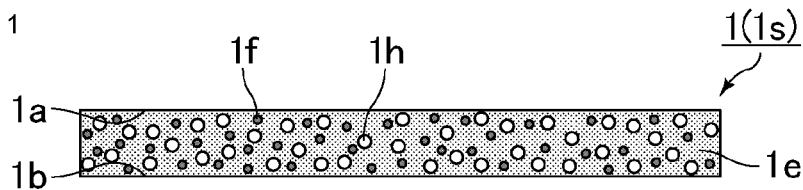
FIG. 1 is a schematic cross-sectional view of an example porous liquid crystal polymer sheet of the present invention.

FIG. 1 is a schematic cross-sectional view of an example porous liquid crystal polymer sheet of the present invention.

A porous liquid crystal polymer sheet 1 illustrated in FIG. 1 has a first main surface 1a and a second main surface 1b. The first main surface 1a faces the second main surface 1b in the thickness direction.

The porous liquid crystal polymer sheet 1 includes a resin sheet 1s containing a first component 1e composed of a liquid crystal polymer and a second component 1f accounting for the highest weight percentage of the resin sheet 1s except for the first component 1e. In the porous liquid crystal polymer sheet 1, the resin sheet 1s has pores 1h. More specifically, the resin sheet 1s in the porous liquid crystal polymer sheet 1 has the pores 1h inside.

The second component in the porous liquid crystal polymer sheet is determined as described below.

First, the presence of organic components other than the liquid crystal polymer in the porous liquid crystal polymer sheet is evaluated by Fourier-transform infrared spectroscopy (FT-IR), pyrolysis-gas chromatography mass spectrometry (pyrolysis GC-MS), differential scanning calorimetry (DSC), or other methods. The presence of inorganic components in the porous liquid crystal polymer sheet is evaluated by thermogravimetry-differential thermal analysis (TG-DTA), X-ray fluorescence analysis (XRF), or other methods. From these evaluation results, the target porous liquid crystal polymer sheets are classified into the following patterns 1 to 3.

Pattern 1: The components other than the liquid crystal polymer are only organic components.
Pattern 2: The components other than the liquid crystal polymer are only inorganic components.
Pattern 3: The components other than the liquid crystal polymer are both organic and inorganic components.

Next, the weight percentage of each component other than the liquid crystal polymer is measured as described below for each pattern determined by the method described above.
<Pattern 1>

The porous liquid crystal polymer sheet is analyzed by pyrolysis-gas chromatography mass spectrometry to identify each organic component and determine the weight percentage of each organic component. Each organic component is identified based on comprehensive analysis including the evaluation results of the pattern determination described above. If it is difficult to determine the weight percentage of each organic component by pyrolysis-gas chromatography mass spectrometry, the weight percentage of each organic component can be estimated from the volume percentage of each organic component determined by using an X-ray CT system.
<Pattern 2>

The liquid crystal polymer is thermally decomposed and volatilized by thermogravimetry-differential thermal analysis to extract only inorganic components from the porous liquid crystal polymer sheet. The extracted inorganic components are then identified by X-ray diffraction (XRD), fluorescent X-ray analysis, inductively coupled plasma atomic emission spectrometry (ICP-AES), or other methods. The weight percentage of each inorganic components is then determined from the measurement results of fluorescent X-ray analysis, inductively coupled plasma atomic emission spectrometry, or other methods.
<Pattern 3>

The weight percentage of each organic component and each inorganic component is determined by a combination of the methods described in <Pattern 1> and <Pattern 2>.

The component accounting for the highest weight percentage of the resin sheet except for the first component (liquid crystal polymer) among the components having the weight percentages determined as described is defined as a second component.

When a region containing the second component is defined as a first region, and a region having a smaller content of the second component than the first region is defined as a second region in the porous liquid crystal polymer sheet of the present invention, the first region has higher compressive strength than the second region.

When a region containing the second component 1f is defined as a first region, and a region having a smaller content of the second component 1f than the first region is defined as a second region in the porous liquid crystal polymer sheet 1 illustrated in FIG. 1, the first region has higher compressive strength than the second region. For example, when a region composed of the first component 1e and the second component 1f is defined as a first region, and a region composed of the first component 1e is defined as a second region in the porous liquid crystal polymer sheet 1, the first region has higher compressive strength than the second region. Since the first region having a larger content of the second component 1f has higher compressive strength than the second region having a smaller content of the second component 1f, it can be said that the second component 1f contributes to an improvement in the compressive strength of the porous liquid crystal polymer sheet 1.

The compressive strength of the first region and the second region of the porous liquid crystal polymer sheet is determined as described below. First, 10 mm square samples are cut out from the first region of the porous liquid crystal polymer sheet, and the samples are stacked on top of each other up to a thickness of about 1 mm. Next, with the obtained multilayer body compressed at a rate of 1 mm/min, the compressive stress against the distortion factor is obtained at given time points by using a compression testing machine. The compressive stress at a time point when the distortion factor becomes 10% is defined as the compressive strength of the first region of the porous liquid crystal polymer sheet. The distortion factor is calculated based on the following formula: distortion factor (%)=[(L1−L2)/L1]×100, where L1 is the thickness of the multilayer body just before the start of the compression test, and L2 is the thickness of the multilayer body at a given time point during the compression test. The compressive strength of the second region of the porous liquid crystal polymer sheet is determined in the same manner as for the compressive strength of the first region of the porous liquid crystal polymer sheet except that samples are cut out from the second region of the porous liquid crystal polymer sheet.

In the porous liquid crystal polymer sheet of the present invention, the second component has an average particle size smaller than the average pore size of the pores.

In the porous liquid crystal polymer sheet 1 illustrated in FIG. 1, the second component 1f has an average particle size smaller than the average pore size of the pores 1h.

In the porous liquid crystal polymer sheet, the second component contributes to an improvement in the compressive strength of the porous liquid crystal polymer sheet as described above. However, the second component simply present is not enough to have a sufficient effect on compressive strength improvement.

In the porous liquid crystal polymer sheet 1, the second component 1f has an average particle size smaller than the average pore size of the pores 1h, and the second component 1f tends to be out of contact with the pores 1h as illustrated in FIG. 1 (i.e., not extending to an inside of the pores). It is thus difficult to generate the boundaries, which may have low compressive strength, between three elements: the first component 1e, the second component 1f, and the pores 1h. As a result, the second component 1f has a sufficient effect on compressive strength improvement.

Figure 2:
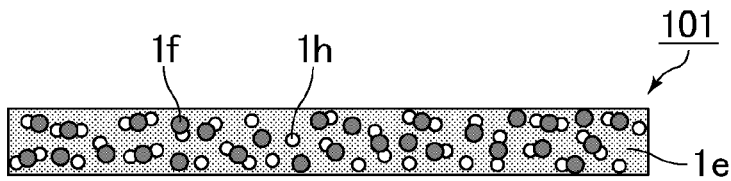
FIG. 2 is a schematic cross-sectional view of the porous liquid crystal polymer sheet in one aspect where the second component has an average particle size larger than or equal to the average pore size of the pores.

FIG. 2 is a schematic cross-sectional view of the porous liquid crystal polymer sheet in one aspect where the second component has an average particle size larger than or equal to the average pore size of the pores.

When the second component 1f has an average particle size larger than or equal to the average pore size of the pores 1h (the second component 1f has an average particle size larger than the average pore size of the pores 1h in this case) as in a porous liquid crystal polymer sheet 101 illustrated in FIG. 2, the second component 1f tends to be in contact with an inside of the pores 1h. In some cases as shown in FIG. 2, the second component 1f also tends to penetrate the first component 1e and extend between adjacent pores 1h. It is thus easy to generate the boundaries, which may have low compressive strength, between three elements, the first component 1e, the second component 1f, and the pores 1h, in the porous liquid crystal polymer sheet 101. As a result, the second component 1f does not have a sufficient effect on compressive strength improvement.

The average particle size of the second component refers to a particle size at a cumulative probability of 50%, that is, a median diameter $D_{50}$, in the number-based cumulative particle size distribution of the second component.

Specifically, the average particle size of the second component is determined as described below. First, the maximum diameter of each particle of the second component in the porous liquid crystal polymer sheet is measured by determining the three-dimensional structure of the second component by using an X-ray CT system, and the obtained maximum diameter is defined as the particle size of the corresponding particle of the second component. The number-based cumulative particle size distribution is then obtained from the particle size of the particles of the second component, and the median diameter $D_{50}$ is defined as the average particle size of the second component.

The average pore size of the pores refers to a pore size at a cumulative probability of 50%, that is, a median diameter $D_{50}$, in the number-based cumulative pore size distribution of the pores.

More specifically, the average pore size of the pores is also determined in the same manner as for the average particle size of the second component.

The porous liquid crystal polymer sheet 1 has high compressive strength since the second component 1f is present in the porous liquid crystal polymer sheet 1 and has an average particle size smaller than the average pore size of the pores 1h, as described above. The porous liquid crystal polymer sheet 1 with high compressive strength has good processability in, for example, pressure bonding of metal layers or formation of via holes during production of electronic circuit boards.

In addition, the electronic circuit board produced by using the porous liquid crystal polymer sheet 1 tends to have improved dielectric properties in a high-frequency region since the porous liquid crystal polymer sheet 1 contains the pores 1h, which contribute to a further reduction in permittivity, in addition to the first component 1e composed of the liquid crystal polymer with low permittivity. The electronic circuit board produced by using the porous liquid crystal polymer sheet 1 undergoes less change in dielectric properties caused by moisture absorption because the first component 1e composed of the liquid crystal polymer has low hygroscopicity.

In the porous liquid crystal polymer sheet of the present invention, the second component is preferably composed of an inorganic filler.

In the porous liquid crystal polymer sheet 1 illustrated in FIG. 1, the second component 1f is preferably composed of an inorganic filler.

The second component 1f composed of an inorganic filler tends to increase the compressive strength of the porous liquid crystal polymer sheet 1.

In addition, the second component 1f composed of an inorganic filler tends to reduce the coefficient of linear expansion of the porous liquid crystal polymer sheet 1. In the metal layer-attached porous liquid crystal polymer sheet and the electronic circuit board produced by using the porous liquid crystal polymer sheet 1, the coefficient of linear expansion of the porous liquid crystal polymer sheet 1 can thus be made close to the coefficient of linear expansion of the metal layer, for example, copper foil. More specifically, the coefficient of linear expansion of the porous liquid crystal polymer sheet 1 in the in-plane direction can be made close to the coefficient of linear expansion of the metal layer, for example, copper foil, in the in-plane direction. Therefore, the metal layer-attached porous liquid crystal polymer sheet and the electronic circuit board are less likely to undergo warpage and dimensional changes.

Examples of the inorganic filler include amorphous silica, zirconium phosphate tungstate, crystalline silica, glass, talc, mica, wollastonite, attapulgite, shirasu balloons, montmorillonite, activated clay, zeolite, sepiolite, xonotlite, copper, gold, silver, lead, iron, tungsten, stainless steel, aluminum, nickel, alloys (Fe—Ni, Fe—Si, Fe—Si—Al, Fe—Si—Cr, Fe—Co, Fe—Si—B—Cr), ferrite, zinc oxide, alumina, calcium oxide, magnesium oxide, titanium oxide, cerium oxide, barium sulfate, potassium titanate, barium titanate, calcium titanate, strontium titanate, calcium carbonate, and boron nitride.

The inorganic filler may have been treated with various surface treatments.

When the second component is composed of an inorganic filler in the porous liquid crystal polymer sheet of the present invention, the coefficient of linear expansion of the inorganic filler is preferably negative in the temperature range of 23° C. to 300° C.

When the second component 1f is composed of an inorganic filler in the porous liquid crystal polymer sheet 1 illustrated in FIG. 1, the coefficient of linear expansion of the inorganic filler is preferably negative in the temperature range of 23° C. to 300° C. The coefficient of linear expansion of the inorganic filler in every direction including the thickness direction and the in-plane direction is preferably negative in the temperature range of 23° C. to 300° C.

When the second component 1f is composed of an inorganic filler, and the coefficient of linear expansion of the inorganic filler is negative in the above temperature range, the porous liquid crystal polymer sheet 1 tends to have a smaller coefficient of linear expansion.

The second component 1f may be composed of an organic polymer.

The second component 1f composed of an organic polymer tends to have high affinity for the first component 1e to ensure the flexibility and elongation of the porous liquid crystal polymer sheet 1.

Examples of the organic polymer include liquid crystal polymers (LCPs), polyether ether ketone (PEEK), thermoplastic polyimide (TPI), polyetherimide (PEI), polyethersulfone (PES), polyphenylene sulfide (PPS), polyamideimides (PAIs), polycarbonates (PCs), and cyclic olefin copolymers (COCs).

When the second component 1f is composed of an organic polymer, and the organic polymer is a liquid crystal polymer, the liquid crystal polymer used as the second component 1f preferably has a higher melting point than the liquid crystal polymer used as the first component 1e.

Common organic polymers include fluorine resins, such as polytetrafluoroethylene (PTFE) described in Patent Document 1. However, if the second component is composed of a fluorine resin, and a region containing the second component is defined as a first region, and a region having a smaller content of the second component than the first region is defined as a second region in the porous liquid crystal polymer sheet of the present invention, the first region does not have higher compressive strength than the second region. In other words, the fluorine resin does not contribute to an improvement in the compressive strength of the porous liquid crystal polymer sheet. Therefore, the fluorine resin is excluded from the possible second component in the porous liquid crystal polymer sheet of the present invention.

To increase the compressive strength of the porous liquid crystal polymer sheet 1 or reduce the coefficient of linear expansion of the porous liquid crystal polymer sheet 1, the second component 1f is preferably composed of an inorganic filler, as described above. To increase the affinity between the first component 1e and the second component 1f, the second component 1f is preferably composed of an organic polymer.

When a temperature that is 50° C. lower than the melting point of the liquid crystal polymer is defined as a reference temperature, the melting point of the second component is preferably higher than the reference temperature in the porous liquid crystal polymer sheet of the present invention. The "melting point of the liquid crystal polymer" in this case refers to the melting point of the liquid crystal polymer used as the first component.

When a temperature that is 50° C. lower than the melting point of the liquid crystal polymer used as the first component 1e is defined as a reference temperature, the melting point of the second component 1f is preferably higher than the reference temperature in the porous liquid crystal polymer sheet 1 illustrated in FIG. 1.

If the melting point of the second component 1f is lower than or equal to the reference temperature, the second component 1f may degrade or decompose due to insufficient heat resistance during formation of the porous liquid crystal polymer sheet 1 (resin sheet 1s).

When the second component 1f is composed of an inorganic filler, and a temperature that is 50° C. lower than the melting point of the liquid crystal polymer used as the first component 1e is defined as a reference temperature, the melting point of the inorganic filler is preferably higher than the reference temperature.

The melting point of the liquid crystal polymer used as the first component and the melting point of the second component are determined as described below from the porous liquid crystal polymer sheet. First, for example, the porous liquid crystal polymer sheet is heated and completely melted by using a differential scanning calorimeter, such as differential scanning calorimeter "DSC 7000X" available from Hitachi High-Tech Science Corporation. In the heating process, the heating rate is, for example, 20° C./min. Next, the obtained melted material is cooled and then heated again. In this case, the cooling process involves, for example, cooling to 175° C. at a cooling rate of 20° C./min, and the heating process involves, for example, heating at a heating rate of 20° C./min. The melting point of the liquid crystal polymer used as the first component and the melting point of the second component are determined from the temperatures corresponding to the respective endothermic peaks observed in the heating process. If it is difficult to identify the endothermic peak of the liquid crystal polymer by the method described above, the melting point of the liquid crystal polymer is determined by observing the texture under crossed Nicols in a polarizing microscope in addition to the method described above. If it is difficult to observe the endothermic peak of the liquid crystal polymer by the method described above, the melting point of the liquid crystal polymer is determined by observing the texture under crossed Nicols in a polarizing microscope.

In the porous liquid crystal polymer sheet of the present invention, the weight percentage of the second component in the resin sheet is preferably 10 wt % to 70 wt %. In the porous liquid crystal polymer sheet of the present invention, the weight percentage of the second component in the resin sheet is more preferably 20 wt % to 50 wt %.

In the porous liquid crystal polymer sheet 1 illustrated in FIG. 1, the weight percentage of the second component 1f in the resin sheet 1s is preferably 10 wt % to 70 wt %, more preferably 20 wt % to 50 wt %.

If the weight percentage of the second component 1f in the resin sheet 1s is less than 10 wt %, the second component 1f may have a little effect on compressive strength improvement.

If the weight percentage of the second component 1f in the resin sheet 1s is more than 70 wt %, the weight percentage of the first component 1e composed of the liquid crystal polymer is relatively small, and the first component 1e may thus have a little effect on hygroscopicity reduction.

When the second component 1f is composed of an inorganic filler, the weight percentage of the inorganic filler in the resin sheet 1s is preferably 10 wt % to 70 wt %, more preferably 20 wt % to 50 wt %.

In the porous liquid crystal polymer sheet of the present invention, the melting point of the liquid crystal polymer is preferably 275° C. to 330° C. The "melting point of the liquid crystal polymer" in this case refers to the melting point of the liquid crystal polymer used as the first component.

In the porous liquid crystal polymer sheet 1 illustrated in FIG. 1, the melting point of the liquid crystal polymer used as the first component 1e is preferably 275° C. to 330° C.

If the melting point of the liquid crystal polymer used as the first component 1e is lower than 275° C., the liquid crystal polymer may degrade or decompose due to insufficient heat resistance when, for example, the electronic circuit board produced by using the porous liquid crystal polymer sheet 1 is integrated into an electronic device by reflow soldering.

If the melting point of the liquid crystal polymer used as the first component 1e is higher than 330° C., for example, the formation of the porous liquid crystal polymer sheet 1 (resin sheet 1s) requires high processing temperatures, which may accelerate degradation of the liquid crystal polymer.

In the porous liquid crystal polymer sheet of the present invention, the liquid crystal polymer preferably contains a copolymer of p-hydroxybenzoic acid and 6-hydroxy-2-naphthoic acid. The "liquid crystal polymer" in this case refers to the liquid crystal polymer used as the first component.

In the porous liquid crystal polymer sheet 1 illustrated in FIG. 1, the liquid crystal polymer used as the first component 1e preferably contains a copolymer of p-hydroxybenzoic acid (HBA) and 6-hydroxy-2-naphthoic acid (HNA).

The copolymer of p-hydroxybenzoic acid and 6-hydroxy-2-naphthoic acid is commonly referred to as a type II wholly aromatic polyester (may also be referred to as type 1.5 wholly aromatic polyester). Type II wholly aromatic polyesters are less subject to hydrolysis than type III partially aromatic polyesters and preferably used as a constituent material of the electronic circuit board produced by using the porous liquid crystal polymer sheet 1. Type II wholly aromatic polyesters have low dissipation factors because of naphthalene rings and contribute to a low electrical energy loss in the porous liquid crystal polymer sheet 1 in the electronic circuit board.

In the porous liquid crystal polymer sheet 1, the liquid crystal polymer used as the first component 1e may further contain a type I wholly aromatic polyester or a type III partially aromatic polyester, or a type I wholly aromatic polyester and a type III partially aromatic polyester, in addition to the type II wholly aromatic polyester.

The type (structure) of each monomer in the liquid crystal polymer can be analyzed by reactive pyrolysis gas chromatography-mass spectrometry (reactive pyrolysis GC-MS).

In the porous liquid crystal polymer sheet of the present invention, the molar ratio of p-hydroxybenzoic acid to 6-hydroxy-2-naphthoic acid in the liquid crystal polymer is preferably 0.20 to 5. The "liquid crystal polymer" in this case refers to the liquid crystal polymer used as the first component.

In the porous liquid crystal polymer sheet 1 illustrated in FIG. 1, the molar ratio of p-hydroxybenzoic acid to 6-hydroxy-2-naphthoic acid in the liquid crystal polymer used as the first component 1e is preferably 0.20 to 5.

If the molar ratio of p-hydroxybenzoic acid to 6-hydroxy-2-naphthoic acid in the liquid crystal polymer used as the first component 1e is less than 0.20 or more than 5, the liquid crystal polymer may have a melting point higher than the preferred range described above.

In the porous liquid crystal polymer sheet of the present invention, the liquid crystal polymer preferably contains 10 mol % or more of p-hydroxybenzoic acid and 10 mol % or more of 6-hydroxy-2-naphthoic acid with respect to 100 mol % of the total monomer content. The "liquid crystal polymer" in this case refers to the liquid crystal polymer used as the first component.

In the porous liquid crystal polymer sheet 1 illustrated in FIG. 1, the liquid crystal polymer used as the first component 1e preferably contains 10 mol % or more of p-hydroxybenzoic acid and 10 mol % or more of 6-hydroxy-2-naphthoic acid with respect to 100 mol % of the total monomer content.

If the monomer content of each of p-hydroxybenzoic acid and 6-hydroxy-2-naphthoic acid in the liquid crystal polymer used as the first component 1e is less than 10 mol %, it may be difficult to realize the following: the liquid crystal polymer exhibits liquid crystallinity, the liquid crystal polymer has a melting point in the preferred range described above, and the liquid crystal polymer has a low dissipation factor.

The monomer ratio and the monomer content for the monomers of the liquid crystal polymer can be analyzed by reactive pyrolysis gas chromatography-mass spectrometry.

The porous liquid crystal polymer sheet of the present invention preferably has a thickness of 10 µm to 200 µm.

The porous liquid crystal polymer sheet 1 illustrated in FIG. 1 preferably has a thickness of 10 µm to 200 µm.

If the porous liquid crystal polymer sheet 1 has a thickness of less than 10 µm, at least one of the first main surface 1a and the second main surface 1b tends to have high porosity in terms of the pores 1h and low smoothness. In this case, when a metal layer is pressure-bonded to the main surface with low smoothness of the porous liquid crystal polymer sheet 1 and then etched into a pattern of wiring or the like, pattern defects tend to appear due to the pores 1h present in the main surface.

If the porous liquid crystal polymer sheet 1 has a thickness of more than 200 µm, it may be difficult to form via holes for forming interconnecting conductors such that the via holes penetrate the porous liquid crystal polymer sheet 1 when electronic circuit boards having interconnecting conductors are produced by using the porous liquid crystal polymer sheet 1.

The thickness of the porous liquid crystal polymer sheet is determined as described below. First, a 100 mm square sample is cut out from the porous liquid crystal polymer sheet. The thickness of a 25 mm square region concentric with the sample is measured at 9 evenly spaced points, and the average thickness is defined as the thickness of the porous liquid crystal polymer sheet. If a 100 mm square sample cannot be cut out from the porous liquid crystal polymer sheet, the thickness of the porous liquid crystal polymer sheet is determined by the same method as that described above except that the porous liquid crystal polymer sheet itself is used as the sample. If the 25 mm square region cannot be obtained in the porous liquid crystal polymer sheet in this case, the thickness of the porous liquid crystal polymer sheet is measured at 9 evenly spaced points, and the average thickness is defined as the thickness of the porous liquid crystal polymer sheet.

The porous liquid crystal polymer sheet 1 (more specifically, the resin sheet 1s) preferably has a closed-pore structure as the configuration of the pores 1h.

The expression "the porous liquid crystal polymer sheet has a closed-pore structure" means that the porous liquid crystal polymer sheet has pores (bubbles) with their walls entirely surrounded by resin. When the pores with their walls not interconnected with each other are observed in the cross section in the thickness direction of the porous liquid crystal polymer sheet and the cross section in the in-plane direction perpendicular to the thickness direction of the porous liquid crystal polymer sheet, the porous liquid crystal polymer sheet is determined to have a closed-pore structure.

The porous liquid crystal polymer sheet 1 when having a closed-pore structure tends to have fewer passes through which the air in the pores 1h escapes to the outside and higher compressive strength than a porous liquid crystal polymer sheet having an interconnected-pore structure. The porous liquid crystal polymer sheet 1 is thus difficult to collapse upon pressure bonding of a metal layer to the porous liquid crystal polymer sheet 1.

The porous liquid crystal polymer sheet 1 is produced by, for example, the following method.

First, a resin material is prepared by mixing the first component 1e composed of a liquid crystal polymer, the second component 1f, and a blowing agent at a predetermined ratio. In this case, the second component 1f is mixed so as to account for the highest weight percentage except for the first component 1e.

Next, the resin material is formed into the resin sheet 1s having the pores 1h by extrusion molding. Examples of extrusion molding include T-die molding and inflation molding.

The porous liquid crystal polymer sheet 1 including the resin sheet 1s having the pores 1h is produced as described above. In the porous liquid crystal polymer sheet 1, the second component 1f has an average particle size smaller than the average pore size of the pores 1h. To make the average particle size of the second component 1f smaller than the average pore size of the pores 1h, for example, the second component 1f with a small average particle size is used or a blowing agent with a large average particle size is used to prepare the resin material.

The metal layer-attached porous liquid crystal polymer sheet of the present invention includes the porous liquid crystal polymer sheet of the present invention and a metal layer on at least one main surface of the porous liquid crystal polymer sheet.

Figure 3:
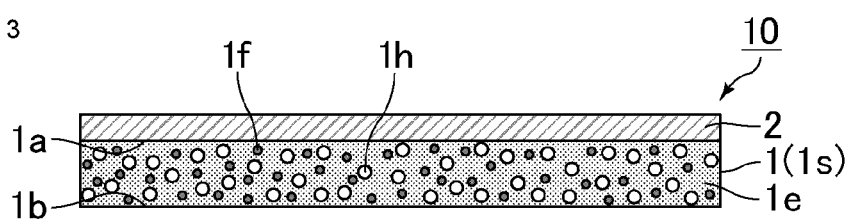
FIG. 3 is a schematic cross-sectional view of an example metal layer-attached porous liquid crystal polymer sheet of the present invention.

FIG. 3 is a schematic cross-sectional view of an example metal layer-attached porous liquid crystal polymer sheet of the present invention.

A metal layer-attached porous liquid crystal polymer sheet 10 illustrated in FIG. 3 includes the porous liquid crystal polymer sheet 1 and a metal layer 2 in the stacking direction.

The stacking direction corresponds to the direction in the thickness direction of the porous liquid crystal polymer sheet of the metal layer-attached porous liquid crystal polymer sheet.

The metal layer 2 is disposed on at least one main surface (the first main surface 1a in this case) of the porous liquid crystal polymer sheet 1. More specifically, the metal layer 2 is adjacent to the first main surface 1a of the porous liquid crystal polymer sheet 1.

The metal layer 2 may be patterned to form wiring or the like or may be planar over the entire surface.

Examples of the constituent material of the metal layer 2 include copper, silver, aluminum, stainless steel, nickel, gold, and alloys containing at least one of these metals.

In the metal layer-attached porous liquid crystal polymer sheet of the present invention, the metal layer is preferably composed of copper foil.

In the metal layer-attached porous liquid crystal polymer sheet 10 illustrated in FIG. 3, the metal layer 2 is preferably composed of copper foil. In this case, the surface of the copper foil may be plated with a metal other than copper.

The thickness of the metal layer 2 is preferably 1 µm to 35 µm, more preferably 6 µm to 18 µm.

The metal layer-attached porous liquid crystal polymer sheet 10 may further include another metal layer on the second main surface 1b of the porous liquid crystal polymer sheet 1, in addition to the metal layer 2.

The metal layer-attached porous liquid crystal polymer sheet 10 is produced by, for example, pressure-bonding the metal layer 2 to the first main surface 1a of the porous liquid crystal polymer sheet 1. The metal layer 2 may be etched into a pattern after being pressure-bonded to the first main surface 1a of the porous liquid crystal polymer sheet 1.

The metal layer-attached porous liquid crystal polymer sheet 10 may be produced by pressure-bonding the patterned metal layer 2 to the first main surface 1a of the porous liquid crystal polymer sheet 1.

An electronic circuit board of the present invention includes the metal layer-attached porous liquid crystal polymer sheet of the present invention.

Figure 4:
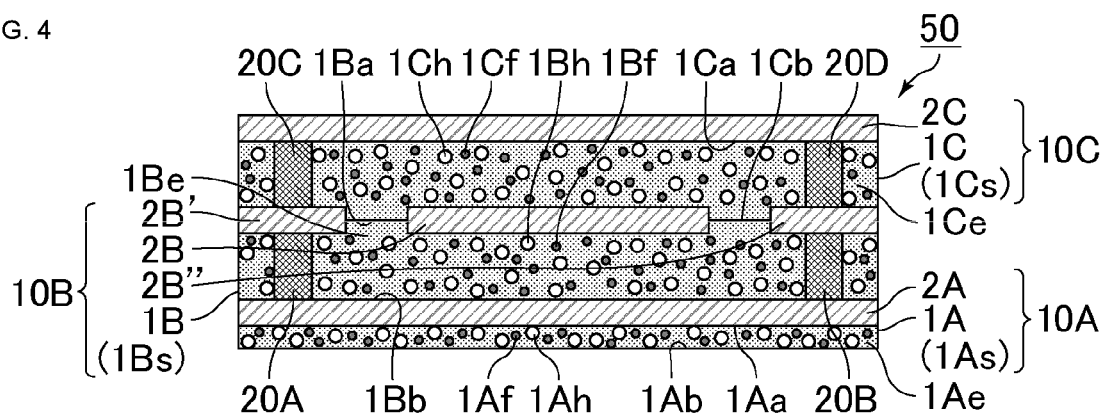
FIG. 4 is a schematic cross-sectional view of an example electronic circuit board of the present invention.

FIG. 4 is a schematic cross-sectional view of an example electronic circuit board of the present invention.

An electronic circuit board 50 illustrated in FIG. 4 includes a metal layer-attached porous liquid crystal polymer sheet 10A, a metal layer-attached porous liquid crystal polymer sheet 10B, and a metal layer-attached porous liquid crystal polymer sheet 10C in order in the stacking direction. In other words, in the electronic circuit board 50, the metal layer-attached porous liquid crystal polymer sheet 10A, the metal layer-attached porous liquid crystal polymer sheet 10B, and the metal layer-attached porous liquid crystal polymer sheet 10C are stacked in order in the stacking direction.

The metal layer-attached porous liquid crystal polymer sheet 10A includes a porous liquid crystal polymer sheet 1A and a metal layer 2A.

The porous liquid crystal polymer sheet 1A has a first main surface 1Aa and a second main surface 1Ab. The first main surface 1Aa faces the second main surface 1Ab in the thickness direction.

The porous liquid crystal polymer sheet 1A includes a resin sheet 1As containing a first component 1Ae composed of a liquid crystal polymer and a second component 1Af accounting for the highest weight percentage of the resin sheet 1As except for the first component 1Ae. In the porous liquid crystal polymer sheet 1A, the resin sheet 1As has pores 1Ah.

When a region containing the second component 1Af is defined as a first region, and a region having a smaller content of the second component 1Af than the first region is defined as a second region in the porous liquid crystal polymer sheet 1A, the first region has higher compressive strength than the second region.

The metal layer 2A is disposed on the first main surface 1Aa of the porous liquid crystal polymer sheet 1A. The metal layer 2A is adjacent to a second main surface 1Bb of a porous liquid crystal polymer sheet 1B described below.

The metal layer-attached porous liquid crystal polymer sheet 10B includes the porous liquid crystal polymer sheet 1B, a metal layer 2B, a metal layer 2B', and a metal layer 2B".

The porous liquid crystal polymer sheet 1B has a first main surface 1Ba and the second main surface 1Bb. The first main surface 1Ba faces the second main surface 1Bb in the thickness direction.

The porous liquid crystal polymer sheet 1B includes a resin sheet 1Bs containing a first component 1Be composed of a liquid crystal polymer and a second component 1Bf accounting for the highest weight percentage of the resin sheet 1Bs except for the first component 1Be. In the porous liquid crystal polymer sheet 1B, the resin sheet 1Bs has pores 1Bh.

When a region containing the second component 1Bf is defined as a first region, and a region having a smaller content of the second component 1Bf than the first region is defined as a second region in the porous liquid crystal polymer sheet 1B, the first region has higher compressive strength than the second region.

The metal layer 2B, the metal layer 2B', and the metal layer 2B" are disposed on the first main surface 1Ba of the porous liquid crystal polymer sheet 1B. The metal layer 2B, the metal layer 2B', and the metal layer 2B" are adjacent to a second main surface 1Cb of a porous liquid crystal polymer sheet 1C described below.

The metal layer-attached porous liquid crystal polymer sheet 10C includes the porous liquid crystal polymer sheet 1C and a metal layer 2C.

The porous liquid crystal polymer sheet 1C has a first main surface 1Ca and the second main surface 1Cb. The first main surface 1Ca faces the second main surface 1Cb in the thickness direction.

The porous liquid crystal polymer sheet 1C includes a resin sheet 1Cs containing a first component 1Ce composed of a liquid crystal polymer and a second component 1Cf accounting for the highest weight percentage of the resin sheet 1Cs except for the first component 1Ce. In the porous liquid crystal polymer sheet 1C, the resin sheet 1Cs has pores 1Ch.

When a region containing the second component 1Cf is defined as a first region, and a region having a smaller content of the second component 1Cf than the first region is defined as a second region in the porous liquid crystal polymer sheet 1C, the first region has higher compressive strength than the second region.

The metal layer 2C is disposed on the first main surface 1Ca of the porous liquid crystal polymer sheet 1C.

Referring to FIG. 4, the metal layer 2B is preferably disposed across the interface between the porous liquid crystal polymer sheet 1B and the porous liquid crystal polymer sheet 1C. The interface between the metal layer 2B and the porous liquid crystal polymer sheet 1B and the interface between the metal layer 2B and the porous liquid crystal polymer sheet 1C are thus out of alignment with the interface between the porous liquid crystal polymer sheet 1B and the porous liquid crystal polymer sheet 1C in the stacking direction. This configuration prevents or reduces peeling at the interface between the metal layer 2B and the porous liquid crystal polymer sheet 1B and peeling at the interface between the metal layer 2B and the porous liquid crystal polymer sheet 1C.

Like the metal layer 2B, the metal layer 2B' and the metal layer 2B" are preferably disposed across the interface between the porous liquid crystal polymer sheet 1B and the porous liquid crystal polymer sheet 1C.

The interface between the porous liquid crystal polymer sheet 1B and the porous liquid crystal polymer sheet 1C is illustrated in FIG. 4, but actually this interface does not necessarily appear clearly. When the interface between the porous liquid crystal polymer sheet 1B and the porous liquid crystal polymer sheet 1C does not appear clearly, the plane passing through the center of the cross section of the metal layer 2B in the stacking direction and disposed in the direction perpendicular to the stacking direction in the cross section in the stacking direction as illustrated in FIG. 4 is regarded as the interface between the porous liquid crystal polymer sheet 1B and the porous liquid crystal polymer sheet 1C.

In the porous liquid crystal polymer sheet 1A, the porous liquid crystal polymer sheet 1B, and the porous liquid crystal polymer sheet 1C, the second component has an average particle size smaller than the average pore size of the pores, as in the porous liquid crystal polymer sheet 1. Like the porous liquid crystal polymer sheet 1, the porous liquid crystal polymer sheet 1A, the porous liquid crystal polymer sheet 1B, and the porous liquid crystal polymer sheet 1C have high compressive strength. The porous liquid crystal polymer sheet 1A, the porous liquid crystal polymer sheet 1B, and the porous liquid crystal polymer sheet 1C each having high compressive strength have good processability in pressure bonding of the metal layers or formation of the via holes during production of the electronic circuit board 50.

Since the electronic circuit board 50 includes the porous liquid crystal polymer sheet 1A, the porous liquid crystal polymer sheet 1B, and the porous liquid crystal polymer sheet 1C, the electronic circuit board 50 tends to have improved dielectric properties in a high-frequency region. The electronic circuit board 50 undergoes less change in dielectric properties caused by moisture absorption.

The second component preferably has an average particle size smaller than the average pore size of the pores in all of the porous liquid crystal polymer sheet 1A, the porous liquid crystal polymer sheet 1B, and the porous liquid crystal polymer sheet 1C. The second component may have an average particle size smaller than the average pore size of the pores in one or some of the porous liquid crystal polymer sheets.

Preferred properties of the porous liquid crystal polymer sheet 1A, the porous liquid crystal polymer sheet 1B, and the porous liquid crystal polymer sheet 1C are the same as those of the porous liquid crystal polymer sheet 1 described above.

The porous liquid crystal polymer sheet 1A, the porous liquid crystal polymer sheet 1B, and the porous liquid crystal polymer sheet 1C may have the same thickness or different thicknesses, or one or some of the porous liquid crystal polymer sheets may have a different thickness as illustrated in FIG. 4.

Examples of the constituent material of the metal layer 2A, the metal layer 2B, the metal layer 2B', the metal layer 2B", and the metal layer 2C include copper, silver, aluminum, stainless steel, nickel, gold, and alloys containing at least one of these metals, which are the same as the constituent material of the metal layer 2.

Like the metal layer 2, the metal layer 2A, the metal layer 2B, the metal layer 2B', the metal layer 2B", and the metal layer 2C are preferably composed of copper foil. In this case, the surface of the copper foil may be plated with a metal other than copper.

The metal layer 2A, the metal layer 2B, the metal layer 2B', the metal layer 2B", and the metal layer 2C are preferably made of the same constituent material, but may be made of different constituent materials, or one or some of the metal layers may be made of a different constituent material.

The metal layer 2A, the metal layer 2B, the metal layer 2B', the metal layer 2B", and the metal layer 2C may have the same thickness as illustrated in FIG. 4, but may have different thicknesses, or one or some of the metal layers may have a different thickness.

The electronic circuit board 50 has three metal layer-attached porous liquid crystal polymer sheets in the stacking direction, but may have only one metal layer-attached porous liquid crystal polymer sheet or may have two or four or more metal layer-attached porous liquid crystal polymer sheets.

In other words, the electronic circuit board 50 includes at least one porous liquid crystal polymer sheet in which the second component has an average particle size smaller than the average pore size of the pores. As long as the electronic circuit board 50 includes at least one porous liquid crystal polymer sheet in which the second component has an average particle size smaller than the average pore size of the pores, the electronic circuit board 50 may include a porous liquid crystal polymer sheet without the second component, may include a porous liquid crystal polymer sheet in which the second component has an average particle size larger than or equal to the average pore size of the pores, or may include a non-porous liquid crystal polymer sheet.

As illustrated in FIG. 4, the electronic circuit board 50 preferably further includes an interconnecting conductor. The interconnecting conductor is connected to a metal layer so as to penetrate a porous liquid crystal polymer sheet in the stacking direction without penetrating the metal layer in the stacking direction. In the example illustrated in FIG. 4, the electronic circuit board 50 further includes an interconnecting conductor 20A, an interconnecting conductor 20B, an interconnecting conductor 20C, and an interconnecting conductor 20D.

The interconnecting conductor 20A is connected to the metal layer 2B' so as to penetrate the porous liquid crystal polymer sheet 1B in the stacking direction without penetrating the metal layer 2B' in the stacking direction. More specifically, the interconnecting conductor 20A is connected to the metal layer 2B' on the first main surface 1Ba side of the porous liquid crystal polymer sheet 1B while penetrating the porous liquid crystal polymer sheet 1B in the stacking direction. The interconnecting conductor 20A is connected to the metal layer 2A on the second main surface 1Bb side of the porous liquid crystal polymer sheet 1B. In other words, the metal layer 2A and the metal layer 2B' are electrically connected to each other with the interconnecting conductor 20A interposed therebetween.

The interconnecting conductor 20B is distant from the interconnecting conductor 20A and connected to the metal layer 2B" so as to penetrate the porous liquid crystal polymer sheet 1B in the stacking direction without penetrating the metal layer 2B" in the stacking direction. More specifically, the interconnecting conductor 20B is distant from the interconnecting conductor 20A and connected to the metal layer 2B" on the first main surface 1Ba side of the porous liquid crystal polymer sheet 1B while penetrating the porous liquid crystal polymer sheet 1B in the stacking direction. The interconnecting conductor 20B is distant from the interconnecting conductor 20A and connected to the metal layer 2A on the second main surface 1Bb side of the porous liquid crystal polymer sheet 1B. In other words, the metal layer 2A and the metal layer 2B" are electrically connected to each other with the interconnecting conductor 20B interposed therebetween.

The interconnecting conductor 20C is connected to the metal layer 2C so as to penetrate the porous liquid crystal polymer sheet 1C in the stacking direction without penetrating the metal layer 2C in the stacking direction. More specifically, the interconnecting conductor 20C is connected to the metal layer 2C on the first main surface 1Ca side of the porous liquid crystal polymer sheet 1C while penetrating the porous liquid crystal polymer sheet 1C in the stacking direction. The interconnecting conductor 20C is connected to the metal layer 2B' on the second main surface 1Cb side of the porous liquid crystal polymer sheet 1C. In other words, the metal layer 2B' and the metal layer 2C are electrically connected to each other with the interconnecting conductor 20C interposed therebetween.

The interconnecting conductor 20D is distant from the interconnecting conductor 20C and connected to the metal layer 2C so as to penetrate the porous liquid crystal polymer sheet 1C in the stacking direction without penetrating the metal layer 2C in the stacking direction. More specifically, the interconnecting conductor 20D is distant from the interconnecting conductor 20C and connected to the metal layer 2C on the first main surface 1Ca side of the porous liquid crystal polymer sheet 1C while penetrating the porous liquid crystal polymer sheet 1C in the stacking direction. The interconnecting conductor 20D is distant from the interconnecting conductor 20C and connected to the metal layer 2B" on the second main surface 1Cb side of the porous liquid crystal polymer sheet 1C. In other words, the metal layer 2B" and the metal layer 2C are electrically connected to each other with the interconnecting conductor 20D interposed therebetween.

In the electronic circuit board 50, the metal layer 2A and the metal layer 2C are thus electrically connected to each other with the interconnecting conductor 20A, the metal layer 2B', and the interconnecting conductor 20C interposed therebetween. In the electronic circuit board 50, the metal layer 2A and the metal layer 2C are also electrically connected to each other with the interconnecting conductor 20B, the metal layer 2B", and the interconnecting conductor 20D interposed therebetween.

The interconnecting conductor 20A is formed by, for example, plating the inner wall of a via hole or performing a heat treatment after filling the via hole with a conductive paste, wherein the via hole penetrates the porous liquid crystal polymer sheet 1B in the thickness direction to reach the metal layer 2B' without penetrating the metal layer 2B' in the thickness direction.

The interconnecting conductor 20B, the interconnecting conductor 20C, and the interconnecting conductor 20D are also formed in the same manner as for the interconnecting conductor 20A except the positions at which the interconnecting conductors are formed.

When the interconnecting conductor 20A, the interconnecting conductor 20B, the interconnecting conductor 20C, and the interconnecting conductor 20D are formed by plating, the metal constituting each of the interconnecting conductors is, for example, copper, tin, silver, or other metals. Of these metals, copper is preferred.

When the interconnecting conductor 20A, the interconnecting conductor 20B, the interconnecting conductor 20C, and the interconnecting conductor 20D are formed by the heat treatment of the conductive paste, the metal contained in each of the interconnecting conductors is, for example, copper, tin, silver, or other metals. In particular, the interconnecting conductors preferably contain copper, and more preferably contain copper and tin. For example, when the interconnecting conductor 20A contains copper and tin, and the metal layer 2B' is composed of copper foil, the interconnecting conductor 20A is alloyed with the metal layer 2B' at low temperatures, so that the interconnecting conductor 20A and the metal layer 2B' easily electrically communicate with each other. The same applies to other combinations of the interconnecting conductors and the metal layers.

When the interconnecting conductor 20A, the interconnecting conductor 20B, the interconnecting conductor 20C, and the interconnecting conductor 20D are formed by the heat treatment of the conductive paste, the resin contained in each of the interconnecting conductors preferably contains at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose resins.

The electronic circuit board 50 may include the metal layer 2B as a signal wire for transmitting signals. In this case, the electronic circuit board 50 includes a transmission line.

The electronic circuit board 50 may include the metal layer 2B as a signal wire for transmitting signals and may include the metal layer 2A and the metal layer 2C as ground electrodes. In this case, the electronic circuit board 50 includes a stripline transmission line.

When the electronic circuit board 50 includes the transmission line described above, the metal layer 2B may be a signal wire for transmitting high-frequency signals.

When the electronic circuit board 50 includes a transmission line, the porous liquid crystal polymer sheet 1B and the porous liquid crystal polymer sheet 1C each having low permittivity in contact with the metal layer 2B, which is a signal wire, easily improve the transmission characteristics of the electronic circuit board 50.

The electronic circuit board 50 is produced by, for example, the following method.

<Step of Preparing Metal Layer-Attached Porous Liquid Crystal Polymer Sheet>

Figure 5:
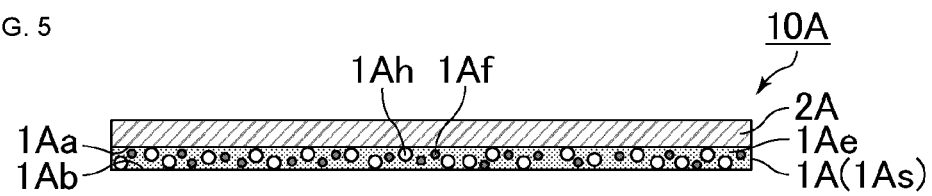
FIG. 5 is a schematic cross-sectional view of a step of preparing a metal layer-attached porous liquid crystal polymer sheet in an example method for producing the electronic circuit board of the present invention.
Figure 6:
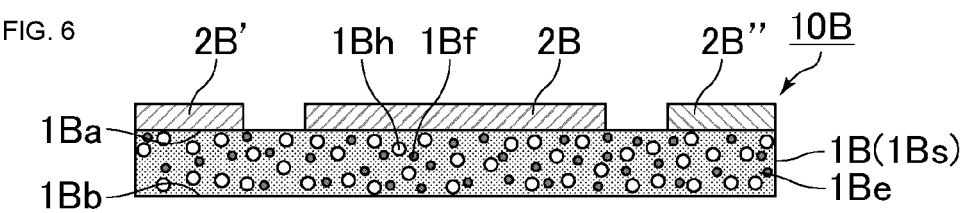
FIG. 6 is a schematic cross-sectional view of a step of preparing the metal layer-attached porous liquid crystal polymer sheet in the example method for producing the electronic circuit board of the present invention.
Figure 7:
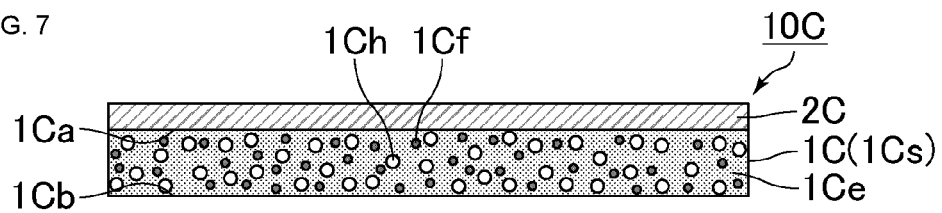
FIG. 7 is a schematic cross-sectional view of a step of preparing the metal layer-attached porous liquid crystal polymer sheet in the example method for producing the electronic circuit board of the present invention.

FIG. 5, FIG. 6, and FIG. 7 are schematic cross-sectional views of the step of preparing a metal layer-attached porous liquid crystal polymer sheet in an example method for producing the electronic circuit board of the present invention.

As illustrated in FIG. 5, the metal layer-attached porous liquid crystal polymer sheet 10A including the metal layer 2A on the first main surface 1Aa of the porous liquid crystal polymer sheet 1A is prepared. In this case, for example, the metal layer 2A is pressure-bonded to the first main surface 1Aa of the porous liquid crystal polymer sheet 1A.

As illustrated in FIG. 6, the metal layer-attached porous liquid crystal polymer sheet 10B including the metal layer 2B, the metal layer 2B', and the metal layer 2B" on the first main surface 1Ba of the porous liquid crystal polymer sheet 1B is prepared. In this case, for example, a metal layer is pressure-bonded to the first main surface 1Ba of the porous liquid crystal polymer sheet 1B, and the metal layer is then etched into a pattern of the metal layer 2B, the metal layer 2B', and the metal layer 2B". Alternatively, the metal layer 2B, the metal layer 2B', and the metal layer 2B" are prepared in advance, and each metal layer is pressure-bonded to the first main surface 1Ba of the porous liquid crystal polymer sheet 1B.

As illustrated in FIG. 7, the metal layer-attached porous liquid crystal polymer sheet 10C including the metal layer 2C on the first main surface 1Ca of the porous liquid crystal polymer sheet 1C is prepared. In this case, for example, the metal layer 2C is pressure-bonded to the first main surface 1Ca of the porous liquid crystal polymer sheet 1C.

<Step of Forming Via Holes>

Figure 8:
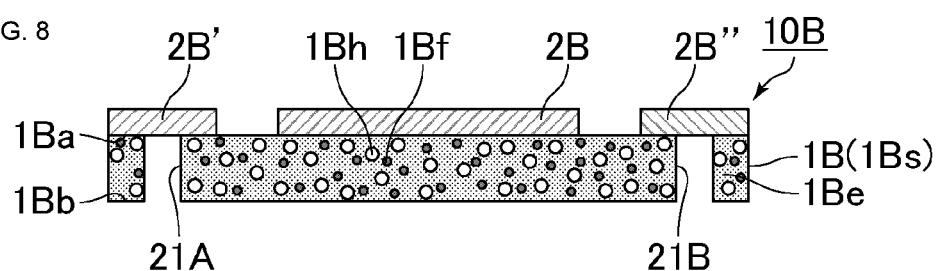
FIG. 8 is a schematic cross-sectional view of a step of forming via holes in the example method for producing the electronic circuit board of the present invention.
Figure 9:
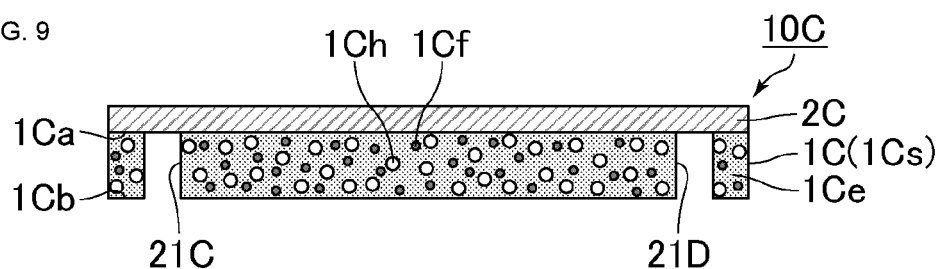
FIG. 9 is a schematic cross-sectional view of a step of forming via holes in the example method for producing the electronic circuit board of the present invention.

FIG. 8 and FIG. 9 are schematic cross-sectional views of the step of forming via holes in the example method for producing the electronic circuit board of the present invention.

As illustrated in FIG. 8, a via hole 21A is formed in the metal layer-attached porous liquid crystal polymer sheet 10B such that the via hole 21A penetrates the porous liquid crystal polymer sheet 1B in the thickness direction to reach the metal layer 2B' without penetrating the metal layer 2B' in the thickness direction. This process causes the metal layer 2B' to be partially exposed through the via hole 21A.

A via hole 21B is formed in the metal layer-attached porous liquid crystal polymer sheet 10B such that the via hole 21B penetrates the porous liquid crystal polymer sheet 1B in the thickness direction to reach the metal layer 2B" without penetrating the metal layer 2B" in the thickness direction. The via hole 21B is distant from the position at which the via hole 21A is to be formed. This process causes the metal layer 2B" to be partially exposed through the via hole 21B.

As described above, the via hole 21A and the via hole 21B are formed in the metal layer-attached porous liquid crystal polymer sheet 10B. In this case, the via hole 21A and the via hole 21B may be formed at the same time or at different times.

As illustrated in FIG. 9, a via hole 21C is formed in the metal layer-attached porous liquid crystal polymer sheet 10C such that the via hole 21C penetrates the porous liquid crystal polymer sheet 1C in the thickness direction to reach the metal layer 2C without penetrating the metal layer 2C in the thickness direction. This process causes the metal layer 2C to be partially exposed through the via hole 21C.

A via hole 21D is formed in the metal layer-attached porous liquid crystal polymer sheet 10C such that the via hole 21D penetrates the porous liquid crystal polymer sheet 1C in the thickness direction to reach the metal layer 2C without penetrating the metal layer 2C in the thickness direction. The via hole 21C is distant from the position at which the via hole 21C is to be formed. This process causes the metal layer 2C to be partially exposed through the via hole 21D.

As described above, the via hole 21C and the via hole 21D are formed in the metal layer-attached porous liquid crystal polymer sheet 10C. In this case, the via hole 21C and the via hole 21D may be formed at the same time or at different times.

The metal layer-attached porous liquid crystal polymer sheet is preferably irradiated with a laser beam from the porous liquid crystal polymer sheet side to form the via hole 21A, the via hole 21B, the via hole 21C, and the via hole 21D.

<Step of Applying Conductive Paste>

Figure 10:
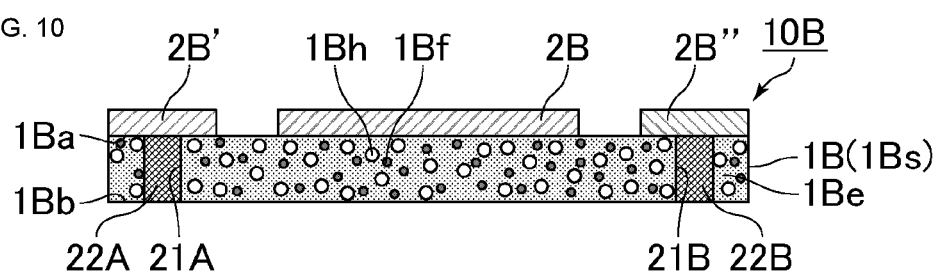
FIG. 10 is a schematic cross-sectional view of a step of applying a conductive paste in the example method for producing the electronic circuit board of the present invention.
Figure 11:
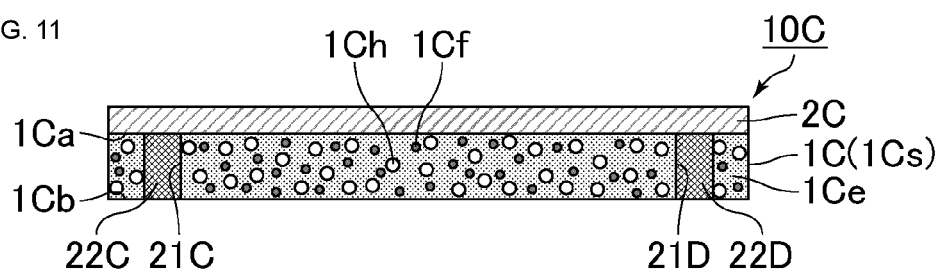
FIG. 11 is a schematic cross-sectional view of the step of applying the conductive paste in the example method for producing the electronic circuit board of the present invention.

FIG. 10 and FIG. 11 are schematic cross-sectional views of the step of applying a conductive paste in the example method for producing the electronic circuit board of the present invention.

As illustrated in FIG. 10, the via hole 21A in the metal layer-attached porous liquid crystal polymer sheet 10B is filled with a conductive paste 22A. The via hole 21B in the metal layer-attached porous liquid crystal polymer sheet 10B is filled with a conductive paste 22B. In this case, the via hole 21A and the via hole 21B may be respectively filled with the conductive paste 22A and the conductive paste 22B at the same time or at different times.

As illustrated in FIG. 11, the via hole 21C in the metal layer-attached porous liquid crystal polymer sheet 10C is filled with a conductive paste 22C. The via hole 21D in the metal layer-attached porous liquid crystal polymer sheet 10C is filled with a conductive paste 22D. In this case, the via hole 21C and the via hole 21D may be respectively filled with the conductive paste 22C and the conductive paste 22D at the same time or at different times.

The conductive paste 22A, the conductive paste 22B, the conductive paste 22C, and the conductive paste 22D are applied by, for example, screen printing or vacuum filling.

The conductive paste 22A, the conductive paste 22B, the conductive paste 22C, and the conductive paste 22D each contain, for example, a metal and a resin.

The metal contained in each of the conductive paste 22A, the conductive paste 22B, the conductive paste 22C, and the conductive paste 22D is, for example, copper, tin, silver, or other metals. In particular, each conductive paste preferably contains copper, and more preferably contains copper and tin.

The resin contained in each of the conductive paste 22A, the conductive paste 22B, the conductive paste 22C, and the conductive paste 22D preferably includes at least one thermosetting resin selected from the group consisting of epoxy resins, phenolic resins, polyimide resins, silicone resins or modified resins thereof, and acrylic resins, or at least one thermoplastic resin selected from the group consisting of polyamide resins, polystyrene resins, polymethacrylic resins, polycarbonate resins, and cellulose resins.

The conductive paste 22A, the conductive paste 22B, the conductive paste 22C, and the conductive paste 22D may each further contain, for example, vehicles, solvents, thixotropic agents, and activators.

Examples of the vehicles include rosin-based resins obtained from rosins and derivatives, such as modified rosins formed by modifying rosins; and synthetic resins obtained from rosins and derivatives, such as modified rosins formed by modifying rosins; and mixtures of these resins.

Examples of the rosin-based resins obtained from rosins and derivatives, such as modified rosins formed by modifying rosins, include gum rosin, tall rosin, wood rosin, polymerized rosin, hydrogenated rosin, formylated rosin, rosin ester, rosin-modified maleic resin, rosin-modified phenolic resin, rosin-modified alkyd resin, other various rosin derivatives.

Examples of the synthetic resins obtained from rosins and derivatives, such as modified rosins formed by modifying rosins, include polyester resins, polyamide resins, phenoxy resins, and terpene resins.

Examples of the solvents include alcohols, ketones, esters, ethers, aromatics, and hydrocarbons. Specific examples include benzyl alcohol, ethanol, isopropyl alcohol, butanol, diethylene glycol, ethylene glycol, glycerol, ethyl cellosolve, butyl cellosolve, ethyl acetate, butyl acetate, butyl benzoate, diethyl adipate, dodecane, tetradecene, α-terpineol, terpineol, 2-methyl-2,4-pentanediol, 2-ethylhexanediol, toluene, xylene, propylene glycol monophenyl ether, diethylene glycol monohexyl ether, ethylene glycol monobutyl ether, diethylene glycol monobutyl ether, diethylene glycol monoethyl ether, diisobutyl adipate, hexylene glycol, cyclohexane dimethanol, 2-terpinyloxy ethanol, 2-dihydroterpinyloxy ethanol, and mixtures thereof. Preferred among these are terpineol, ethylene glycol monobutyl ether, diethylene glycol monobutyl ether, or diethylene glycol monoethyl ether.

Examples of the thixotropic agents include hydrogenated castor oil, carnauba wax, amides, hydroxy fatty acids, dibenzylidene sorbitol, bis(p-methylbenzylidene)sorbitol, beeswax, stearamide, and ethylenebisamide hydroxystearate. These thixotropic agents may further contain, as needed, fatty acids, such as caprylic acid, lauric acid, myristic acid, palmitic acid, stearic acid, and behenic acid; hydroxy fatty acids, such as 1,2-hydroxystearic acid; antioxidants; surfactants; and amines.

Examples of the activators include amine hydrohalides, organohalogen compounds, organic acids, organic amines, and polyhydric alcohols.

Examples of the amine hydrohalides include diphenylguanidine hydrobromide, diphenylguanidine hydrochloride, cyclohexylamine hydrobromide, ethylamine hydrochloride, ethylamine hydrobromide, diethylaniline hydrobromide, diethylaniline hydrochloride, triethanolamine hydrobromide, and monoethanolamine hydrobromide.

Examples of the organohalogen compounds include chlorinated paraffins, tetrabromoethane, dibromopropanol, 2,3-dibromo-1,4-butanediol, 2,3-dibromo-2-butene-1,4-diol, and tris(2,3-dibromopropyl) isocyanurate.

Examples of the organic acids include malonic acid, fumaric acid, glycolic acid, citric acid, malic acid, succinic acid, phenyl succinic acid, maleic acid, salicylic acid, anthranilic acid, glutaric acid, suberic acid, adipic acid, sebacic acid, stearic acid, abietic acid, benzoic acid, trimellitic acid, pyromellitic acid, and dodecanoic acid.

Examples of the organic amines include monoethanolamine, diethanolamine, triethanolamine, tributylamine, aniline, and diethylaniline.

Examples of the polyhydric alcohols include erythritol, pyrogallol, and ribitol.

<Step of Forming Interconnecting Conductors>

FIG. 12 is a schematic cross-sectional view of a step of forming interconnecting conductors in the example method for producing the electronic circuit board of the present invention.

As illustrated in FIG. 12, the metal layer-attached porous liquid crystal polymer sheet 10A, the metal layer-attached porous liquid crystal polymer sheet 10B filled with the conductive paste 22A and the conductive paste 22B, and the metal layer-attached porous liquid crystal polymer sheet 10C filled with the conductive paste 22C and the conductive paste 22D are stacked in order in the stacking direction. At this time, the metal layer-attached porous liquid crystal polymer sheets 10A, 10B, and 10C are stacked such that the surface (upper surface) of the metal layer 2A of the metal layer-attached porous liquid crystal polymer sheet 10A is in contact with the surface (lower surface) of the porous liquid crystal polymer sheet 1B of the metal layer-attached porous liquid crystal polymer sheet 10B, and the surfaces (upper surfaces) of the metal layers 2B (metal layer 2B' and metal layer 2B") of the metal layer-attached porous liquid crystal polymer sheet 10B are in contact with the surface (lower surface) of the porous liquid crystal polymer sheet 1C of the metal layer-attached porous liquid crystal polymer sheet 10C. In FIG. 12, the metal layer-attached porous liquid crystal polymer sheets are illustrated at a distance from each other for convenience of description.

The obtained multilayer body is hot-pressed by applying pressure in the stacking direction with heating. In this process, the metal layer-attached porous liquid crystal polymer sheet 10A is pressure-bonded to the metal layer-attached porous liquid crystal polymer sheet 10B, and the metal layer-attached porous liquid crystal polymer sheet 10B is pressure-bonded to the metal layer-attached porous liquid crystal polymer sheet 10C. The conductive paste 22A, the conductive paste 22B, the conductive paste 22C, and the conductive paste 22D are solidified in hot pressing into the interconnecting conductor 20A, the interconnecting conductor 20B, the interconnecting conductor 20C, and the interconnecting conductor 20D, respectively. The interconnecting conductor 20A, the interconnecting conductor 20B, the interconnecting conductor 20C, and the interconnecting conductor 20D are thus formed in the via hole 21A, the via hole 21B, the via hole 21C, and the via hole 21D, respectively.

To form the interconnecting conductor 20A, the interconnecting conductor 20B, the interconnecting conductor 20C, and the interconnecting conductor 20D, the inner walls of the via holes may be plated with a metal, such as copper, tin, or silver, instead of filling the via holes with the conductive paste.

The electronic circuit board 50 illustrated in FIG. 4 is produced as described above.

EXAMPLES

Examples, which more specifically disclose the porous liquid crystal polymer sheet of the present invention, will be described below. The present invention is not limited only to the following Examples.

Example 1

First, a liquid crystal polymer A was prepared as a first component. The liquid crystal polymer A was a copolymer of p-hydroxybenzoic acid and 6-hydroxy-2-naphthoic acid at a molar ratio of p-hydroxybenzoic acid to 6-hydroxy-2-naphthoic acid of 80:20. The liquid crystal polymer A had a melting point of 325° C. An amorphous silica A was prepared as a second component. The amorphous silica A had an average particle size of 3 μm, a melting point of higher than 500° C., and a positive coefficient of linear expansion in every direction in the temperature range of 23° C. to 300° C. Next, a resin material was prepared by mixing 70 parts by weight of the liquid crystal polymer A, 30 parts by weight of the amorphous silica A, and 0.4 parts by weight of a blowing agent "VINYFOR AC #6-K6" (main component: azodicarbonamide) available from Eiwa Chemical Ind. Co., Ltd. A porous liquid crystal polymer sheet of Example 1 was produced by using the prepared resin material by T-die molding. The thickness of the porous liquid crystal polymer sheet of Example 1 was measured by the method described above and found to be 50 μm.

Example 2

A porous liquid crystal polymer sheet of Example 2 was produced in the same manner as for the porous liquid crystal polymer sheet of Example 1 except that an amorphous silica B was used as a second component. The amorphous silica B had an average particle size of 6 μm, a melting point of higher than 500° C., and a positive coefficient of linear expansion in every direction in the temperature range of 23° C. to 300° C.

Example 3

A porous liquid crystal polymer sheet of Example 3 was produced in the same manner as for the porous liquid crystal polymer sheet of Example 1 except that zirconium phosphate tungstate was used as a second component. Zirconium phosphate tungstate had an average particle size of 1.3 μm, a melting point of higher than 500° C., and a negative coefficient of linear expansion in every direction in the temperature range of 23° C. to 300° C.

Example 4

A porous liquid crystal polymer sheet of Example 4 was produced in the same manner as for the porous liquid crystal polymer sheet of Example 1 except that a liquid crystal polymer B was used as a first component, and the amount of the blowing agent mixed was 0.2 parts by weight. The liquid crystal polymer B was a copolymer of p-hydroxybenzoic acid and 6-hydroxy-2-naphthoic acid at a molar ratio of p-hydroxybenzoic acid to 6-hydroxy-2-naphthoic acid of 73:27. The liquid crystal polymer B had a melting point of 280° C.

Example 5

A porous liquid crystal polymer sheet of Example 5 was produced in the same manner as for the porous liquid crystal polymer sheet of Example 1 except that the liquid crystal polymer B was used as a first component, zirconium phosphate tungstate described in Example 3 was used as a second component, and the amount of the blowing agent mixed was 0.2 parts by weight.

Example 6

A porous liquid crystal polymer sheet of Example 6 was produced in the same manner as for the porous liquid crystal polymer sheet of Example 1 except that a liquid crystal polymer having an average particle size of 5 μm, a melting point of 370° C., and a positive coefficient of linear expansion in every direction in the temperature range of 23° C. to 300° C. was used as a second component.

Comparative Example 1

A porous liquid crystal polymer sheet of Comparative Example 1 was produced in the same manner as for the porous liquid crystal polymer sheet of Example 1 except that polytetrafluoroethylene was used as a second component. Polytetrafluoroethylene had an average particle size of 3.5 μm, a melting point of 327° C., and a positive coefficient of linear expansion in every direction in the temperature range of 23° C. to 300° C.

Comparative Example 2

A porous liquid crystal polymer sheet of Comparative Example 2 was produced in the same manner as for the porous liquid crystal polymer sheet of Example 1 except that the amount of the first component mixed was 100 parts by weight, and no second component was mixed.

Comparative Example 3

A porous liquid crystal polymer sheet of Comparative Example 3 was produced in the same manner as for the porous liquid crystal polymer sheet of Example 1 except that the liquid crystal polymer B was used as a first component, polytetrafluoroethylene described in Example 1 was used as a second component, and the amount of the blowing agent mixed was 0.2 parts by weight.

Comparative Example 4

A porous liquid crystal polymer sheet of Comparative Example 4 was produced in the same manner as for the porous liquid crystal polymer sheet of Example 1 except that the liquid crystal polymer B was used as a first component, the amount of the liquid crystal polymer B mixed was 100 parts by weight, no second component was mixed, and the amount of the blowing agent mixed was 0.2 parts by weight.

Comparative Example 5

A porous liquid crystal polymer sheet of Comparative Example 5 was produced in the same manner as for the porous liquid crystal polymer sheet of Example 1 except that the liquid crystal polymer B was used as a first component, the amorphous silica B was used as a second component, and the amount of the blowing agent mixed was 0.2 parts by weight.

Comparative Example 6

A porous liquid crystal polymer sheet of Comparative Example 6 was produced in the same manner as for the porous liquid crystal polymer sheet of Example 1 except that the liquid crystal polymer B was used as a first component, the liquid crystal polymer described in Example 6 was used as a second component, and the amount of the blowing agent mixed was 0.2 parts by weight.

[Evaluation]

The porous liquid crystal polymer sheets of Examples 1 to 6 and Comparative Examples 1 to 6 were subjected to the following measurements. The results are shown in Table 1.

<Average Pore Size>

First, the maximum diameter of each pore in the porous liquid crystal polymer sheet was measured by determining the three-dimensional structure of the corresponding pore by using an X-ray CT system, and the obtained maximum diameter was defined as the pore size of the pore. The number-based cumulative pore size distribution was then obtained from the pore size of the pores, and the median diameter $D_{50}$ was defined as the average pore size of the pores.

<Porosity>

First, a 100 mm square sample was cut out from the porous liquid crystal polymer sheet, and the area s, thickness t, and weight m of the sample were measured. The specific gravity σ of the resin component of the porous liquid crystal polymer sheet was measured in accordance with JIS Z 8807-2012. The porosity of the porous liquid crystal polymer sheet was calculated based on the following formula: porosity (vol %)=[1−(m/(s×t×σ)]×100.

<Compressive Strength>

First, 10 mm square samples were cut out from the porous liquid crystal polymer sheet, and the samples were stacked on top of each other up to a thickness of about 1 mm. Next, with the obtained multilayer body compressed at a rate of 1 mm/min, the compressive stress against the distortion factor was obtained at given time points by using a compression testing machine. The compressive stress at a time point when the distortion factor became 10% was defined as the compressive strength of the porous liquid crystal polymer sheet. The distortion factor was calculated based on the following formula: distortion factor (%)=[(L1−L2)/L1]×100, where L1 is the thickness of the multilayer body just before the start of the compression test, and L2 is the thickness of the multilayer body at a given time point during the compression test. The compressive strength of the porous liquid crystal polymer sheet was evaluated based on the following criteria.

A (excellent): The compressive strength was 100 MPa or more.
B (good): The compressive strength was 50 MPa to less than 100 MPa.
C (poor): The compressive strength was less than 50 MPa.

<Coefficient of Linear Expansion>

First, a 20 mm×4 mm sample was cut out from the porous liquid crystal polymer sheet and placed under a probe of a thermo-mechanical analyzer available from Seiko Instruments Inc. with a chuck distance of 10 mm. Next, the sample was heated to 170° C. at a heating rate of 40° C./min and then cooled to 30° C. at a cooling rate of 10° C./min under a load of 5 g. The coefficient of linear expansion of the porous liquid crystal polymer sheet was obtained by measuring the amount of change in chuck distance in the temperature range from 100° C. to 50° C. in the cooling process. In this evaluation, the coefficient of linear expansion of the sample of the porous liquid crystal polymer sheet was obtained in the longitudinal direction "also referred to as the machine direction (MD)" and the width direction "also referred to as the transverse direction (TD)" by the method described above, and the average coefficient of linear expansion was defined as the coefficient of linear expansion of the porous liquid crystal polymer sheet. The coefficient of linear expansion of the porous liquid crystal polymer sheet was evaluated based on the following criteria.

A (excellent): The coefficient of linear expansion was less than 20 ppm/K.
B (good): The coefficient of linear expansion was 20 ppm/K to less than 25 ppm/K.
C (poor): The coefficient of linear expansion was 25 ppm/K or more.

TABLE 1

| | | | | Example 1 | Example 2 | Example 3 | Example 4 | Example 5 | Example 6 |
|---|---|---|---|---|---|---|---|---|---|
| Weight percentage (wt %) | First component | | Liquid crystal polymer A | 70 | 70 | 70 | 0 | 0 | 70 |
| | | | Liquid crystal polymer B | 0 | 0 | 0 | 70 | 70 | 0 |
| | Second component | Inorganic filler | Amorphous silica A | 30 | 0 | 0 | 30 | 0 | 0 |
| | | | Amorphous silica B | 0 | 30 | 0 | 0 | 0 | 0 |
| | | | Zirconium phosphate tungstate | 0 | 0 | 30 | 0 | 30 | 0 |
| | | Organic polymer | Liquid crystal polymer | 0 | 0 | 0 | 0 | 0 | 30 |
| | | | Polytetrafluoroethylene | 0 | 0 | 0 | 0 | 0 | 0 |
| Average particle size (μm) of second component | | | | 3 | 6 | 1.3 | 3 | 1.3 | 5 |
| Average pore size (μm) | | | | 8 | 8 | 8 | 4 | 4 | 8 |
| Porosity (vol %) | | | | 50 | 50 | 50 | 35 | 35 | 50 |
| Compressive strength | | | | A | A | A | A | A | B |
| Coefficient of linear expansion | | | | B | B | A | B | A | C |

TABLE 1-continued

|  |  |  |  | Comparative Example 1 | Comparative Example 2 | Comparative Example 3 | Comparative Example 4 | Comparative Example 5 | Comparative Example 6 |
|---|---|---|---|---|---|---|---|---|---|
| Weight percentage (wt %) | First component |  | Liquid crystal polymer A | 70 | 100 | 0 | 0 | 0 | 0 |
|  |  |  | Liquid crystal polymer B | 0 | 0 | 70 | 100 | 70 | 70 |
|  | Second component | Inorganic filler | Amorphous silica A | 0 | 0 | 0 | 0 | 0 | 0 |
|  |  |  | Amorphous silica B | 0 | 0 | 0 | 0 | 30 | 0 |
|  |  |  | Zirconium phosphate tungstate | 0 | 0 | 0 | 0 | 0 | 0 |
|  |  | Organic polymer | Liquid crystal polymer | 0 | 0 | 0 | 0 | 0 | 30 |
|  |  |  | Polytetrafluoro-ethylene | 30 | 0 | 30 | 0 | 0 | 0 |
| Average particle size (μm) of second component |  |  |  | 3.5 | — | 3.5 | — | 6 | 5 |
| Average pore size (μm) |  |  |  | 8 | 8 | 4 | 4 | 4 | 4 |
| Porosity (vol %) |  |  |  | 50 | 50 | 35 | 35 | 35 | 35 |
| Compressive strength |  |  |  | C | C | C | C | C | C |
| Coefficient of linear expansion |  |  |  | C | C | C | C | B | C |

Referring to Table 1, the porous liquid crystal polymer sheets of Examples 1 to 6, which contained the second component and in which the second component had an average particle size smaller than the average pore size of the pores, had high compressive strength.

More specifically, the porous liquid crystal polymer sheets of Examples 1 to 6 containing the second component had higher compressive strength than the porous liquid crystal polymer sheets of Comparative Example 2 and Comparative Example 4 with no second component.

When a region containing the second component is defined as a first region, and a region having a smaller content of the second component than the first region is defined as a second region in the porous liquid crystal polymer sheets of Examples 1 to 6, the relationship in terms of compressive strength between the first region and the second region is considered the same as the relationship in terms of compressive strength between the porous liquid crystal polymer sheets of Examples 1 to 6 containing the second component and the porous liquid crystal polymer sheets of Comparative Example 2 and Comparative Example 4 with no second component. In other words, it can be said that the first region has higher compressive strength than the second region in the porous liquid crystal polymer sheets of Examples 1 to 6. It can thus be said that the second component contained in the porous liquid crystal polymer sheets of Examples 1 to 6 contributes to improved compressive strength.

The porous liquid crystal polymer sheets of Examples 1 to 6 in which the second component was not polytetrafluoroethylene had higher compressive strength than the porous liquid crystal polymer sheets of Comparative Example 1 and Comparative Example 3 in which the second component was polytetrafluoroethylene. In other words, it can be said that polytetrafluoroethylene does not contribute to an improvement in the compressive strength of the porous liquid crystal polymer sheet. This may also be true when the second component is a fluorine resin other than polytetrafluoroethylene.

In addition, the porous liquid crystal polymer sheets of Examples 1 to 6 in which the second component had an average particle size smaller than the average pore size of the pores had higher compressive strength than the porous liquid crystal polymer sheets of Comparative Example 5 and Comparative Example 6 in which the second component had an average particle size larger than the average pore size of the pores.

The foregoing results indicate that, to obtain porous liquid crystal polymer sheets having high compressive strength, it is important that the second component contributing to improved compressive strength be contained and have an average particle size smaller than the average pore size of the pores as in the porous liquid crystal polymer sheets of Examples 1 to 6.

Of the porous liquid crystal polymer sheets of Examples 1 to 6, the porous liquid crystal polymer sheets of Example 1, Example 2, Example 3, Example 4, and Example 5 in which the second component was composed of an inorganic filler had a smaller coefficient of linear expansion, and the porous liquid crystal polymer sheets of Example 3 and Example 5 in which the inorganic filler had a negative coefficient of linear expansion in every direction in the temperature range of 23° C. to 300° C. had a still smaller coefficient of linear expansion.

REFERENCE SIGNS LIST 1, 1A, 1B, 1C, 101 Porous liquid crystal polymer sheet
1a, 1Aa, 1Ba, 1Ca First main surface of porous liquid crystal polymer sheet
1b, 1Ab, 1Bb, 1Cb Second main surface of porous liquid crystal polymer sheet
1e, 1Ae, 1Be, 1Ce First component
1f, 1Af, 1Bf, 1Cf Second component
1h, 1Ah, 1Bh, 1Ch Pore
1s, 1As, 1Bs, 1Cs Resin sheet
2, 2A, 2B, 2B', 2B", 2C Metal layer
10, 10A, 10B, 10C Metal layer-attached porous liquid crystal polymer sheet
20A, 20B, 20C, 20D Interconnecting conductor
21A, 21B, 21C, 21D Via hole
22A, 22B, 22C, 22D Conductive paste
50 Electronic circuit board

The invention claimed is:
1. A porous liquid crystal polymer sheet comprising:
a resin sheet having pores and containing a first component composed of a liquid crystal polymer and a second component accounting for a highest weight percentage among all components of the resin sheet except for the first component,
wherein, a region in the porous liquid crystal polymer sheet containing the second component is a first region, a region in the porous liquid crystal polymer sheet having a smaller content of the second component than the first region is a second region, and the first region has a higher compressive strength than the second region, the second component has an average particle size smaller than an average pore size of the pores of the resin sheet, and the second component is not inside of the pores.

2. The porous liquid crystal polymer sheet according to claim 1, wherein the second component is composed of an inorganic filler.

3. The porous liquid crystal polymer sheet according to claim 2, wherein the inorganic filler is selected from amorphous silica, zirconium phosphate tungstate, crystalline silica, glass, talc, mica, wollastonite, attapulgite, shirasu balloons, montmorillonite, activated clay, zeolite, sepiolite, xonotlite, copper, gold, silver, lead, iron, tungsten, stainless steel, aluminum, nickel, Fe alloys, ferrite, zinc oxide, alumina, calcium oxide, magnesium oxide, titanium oxide, cerium oxide, barium sulfate, potassium titanate, barium titanate, calcium titanate, strontium titanate, calcium carbonate, and boron nitride.

4. The porous liquid crystal polymer sheet according to claim 1, wherein the second component is composed of an organic polymer.

5. The porous liquid crystal polymer sheet according to claim 4, wherein the organic polymer is selected from liquid crystal polymers, polyether ether ketones, thermoplastic polyimides, polyetherimides, polyethersulfones, polyphenylene sulfide, polyamide-imides, polycarbonates, and cyclic olefin copolymers.

6. The porous liquid crystal polymer sheet according to claim 2, wherein the inorganic filler has a negative coefficient of linear expansion in a temperature range of 23° C. to 300° C.

7. The porous liquid crystal polymer sheet according to claim 1, wherein the second component has a melting point higher than a temperature that is 50° C. lower than a melting point of the liquid crystal polymer.

8. The porous liquid crystal polymer sheet according to claim 1, wherein a weight percentage of the second component in the resin sheet is 10 wt % to 70 wt %.

9. The porous liquid crystal polymer sheet according to claim 8, wherein the weight percentage of the second component in the resin sheet is 20 wt % to 50 wt %.

10. The porous liquid crystal polymer sheet according to claim 1, wherein the liquid crystal polymer has a melting point of 275° C. to 330° C.

11. The porous liquid crystal polymer sheet according to claim 1, wherein the liquid crystal polymer contains a copolymer of p-hydroxybenzoic acid and 6-hydroxy-2-naphthoic acid.

12. The porous liquid crystal polymer sheet according to claim 11, wherein a molar ratio of the p-hydroxybenzoic acid to the 6-hydroxy-2-naphthoic acid in the liquid crystal polymer is 0.20 to 5.

13. The porous liquid crystal polymer sheet according to claim 11, wherein the liquid crystal polymer contains 10 mol % or more of the p-hydroxybenzoic acid and 10 mol % or more of the 6-hydroxy-2-naphthoic acid with respect to 100 mol % of a total monomer content.

14. The porous liquid crystal polymer sheet according to claim 1, wherein the porous liquid crystal polymer sheet has a thickness of 10 μm to 200 μm.

15. The porous liquid crystal polymer sheet according to claim 1, wherein the resin sheet has a closed-pore structure.

16. The porous liquid crystal polymer sheet according to claim 1, wherein the average particle size of the second component is 1.3 to 6 μm.

17. A metal layer-attached porous liquid crystal polymer sheet comprising:

the porous liquid crystal polymer sheet according to claim 1; and a metal layer on at least one main surface of the porous liquid crystal polymer sheet.

18. The metal layer-attached porous liquid crystal polymer sheet according to claim 17, wherein the metal layer is composed of copper foil.

19. An electronic circuit board comprising the metal layer-attached porous liquid crystal polymer sheet according to claim 17.

* * * * *